(12) United States Patent
Murata et al.

(10) Patent No.: US 8,237,980 B2
(45) Date of Patent: Aug. 7, 2012

(54) SERIAL INTERFACE DEVICE AND IMAGE FORMING APPARATUS

(75) Inventors: Tatsuhiko Murata, Kyoto (JP); Masayu Fujiwara, Kyoto (JP); Tomoki Yamamoto, Kyoto (JP); Takeshi Matsuzaki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 1103 days.

(21) Appl. No.: 11/751,796

(22) Filed: May 22, 2007

(65) Prior Publication Data

US 2007/0296617 A1   Dec. 27, 2007

(30) Foreign Application Priority Data

May 23, 2006   (JP) .................................. 2006-142654

(51) Int. Cl.
*H03M 5/08* (2006.01)
*H03M 5/22* (2006.01)
*H03M 9/00* (2006.01)
*H04N 1/00* (2006.01)

(52) U.S. Cl. ............... 358/1.6; 358/426.03; 358/426.04; 358/426.06; 341/53; 341/54; 341/100; 341/101

(58) Field of Classification Search ........................ None
See application file for complete search history.

(56) References Cited

U.S. PATENT DOCUMENTS

| 2002/0067785 | A1 | 6/2002 | Tanahashi |
| 2004/0013316 | A1* | 1/2004 | Park et al. ..................... 382/276 |
| 2006/0125851 | A1* | 6/2006 | Hwang ............................. 347/5 |

FOREIGN PATENT DOCUMENTS

| JP | 10-289032 | 10/1998 |
| JP | 2000-324285 | 11/2000 |
| JP | 2002-169771 | 6/2002 |
| JP | 2005-286597 | 10/2005 |

\* cited by examiner

*Primary Examiner* — Benny Q Tieu
*Assistant Examiner* — Haris Sabah
(74) *Attorney, Agent, or Firm* — Fish & Richardson P.C.

(57) ABSTRACT

A serial I/F has: a FIFO portion to which m- or n-bit (m<n) parallel data is written based on PCLK; a FIFO reader that reads the parallel data written to the FIFO portion m bits at a time based on FCLK; a parallel/serial converter that converts the m-bit parallel data read by the FIFO reader into 1-bit serial data based on PLLCLK; a PLL circuit that produces PLLCLK by multiplying PCLK by a factor of m or n; and a frequency divider circuit that produces FCLK by dividing the frequency of PLLCLK by m. Here, the multiplication factor of the PLL circuit is so controlled as to be changed according to the number of bits of the parallel data written to the FIFO portion. This makes it possible to flexibly deal with parallel inputs having different bus widths without unduly increasing a device scale and cost.

5 Claims, 6 Drawing Sheets

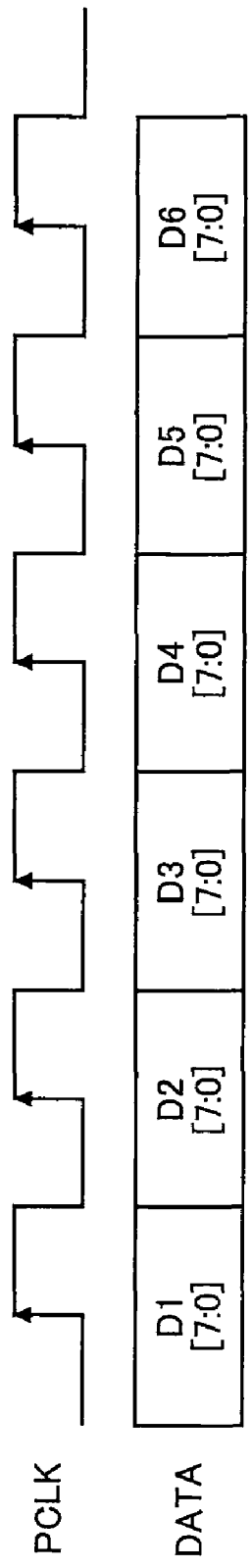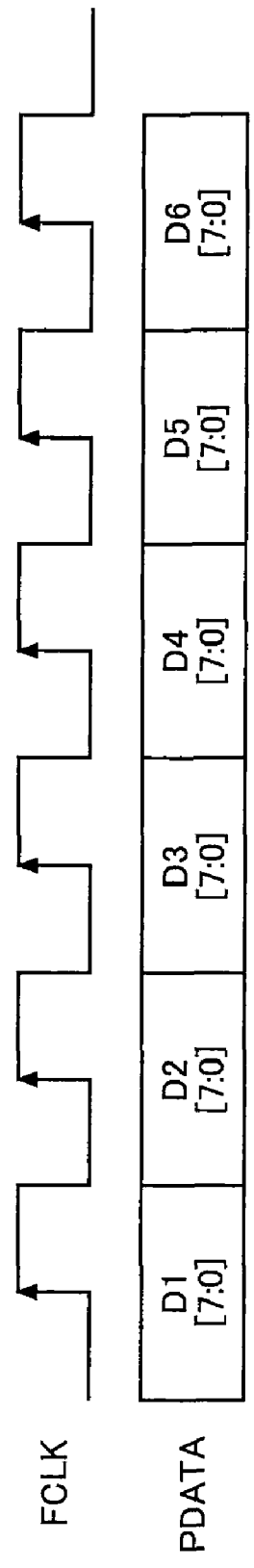

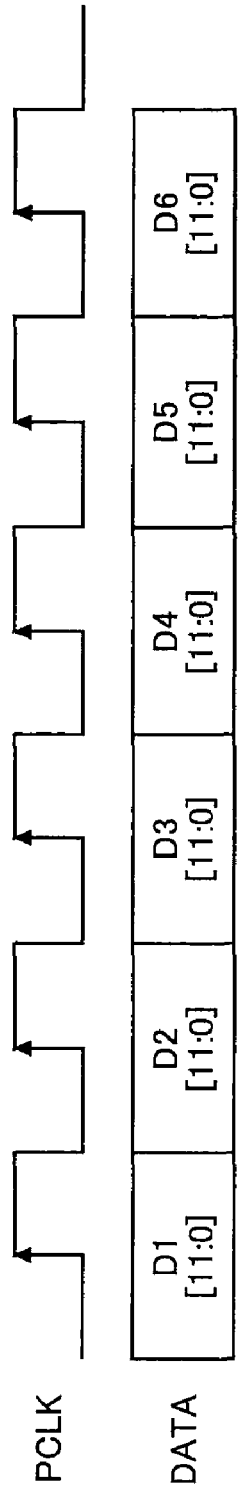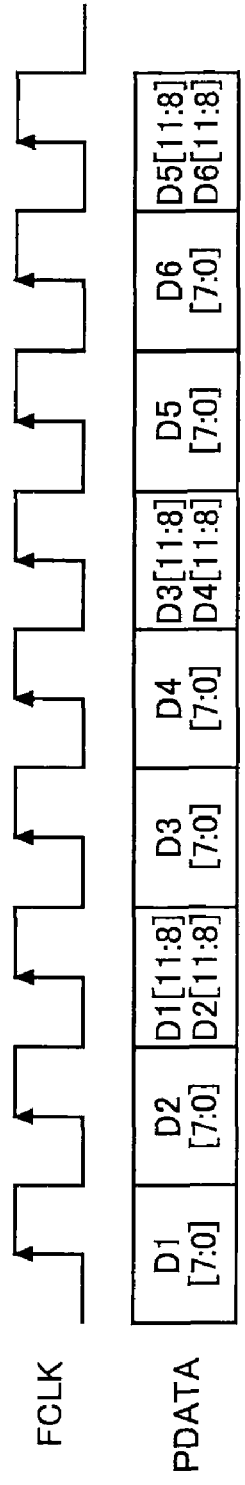

SERIAL INTERFACE DEVICE AND IMAGE FORMING APPARATUS

This application is based on Japanese Patent Application No. 2006-142654 filed on May 23, 2006, the contents of which are hereby incorporated by reference.

BACKGROUND OF THE INVENTION

1. Field of the Invention

The present invention relates to serial interface devices having a plurality of input bus widths, and to image forming apparatuses using such serial interface devices.

2. Description of Related Art

In image forming apparatuses such as digital still cameras, digital video cameras, or scanners, an image signal (a pixel signal) obtained by an image sensor module is typically inputted in parallel to a serial interface device provided near the image sensor module, and then undergoes predetermined image processing there. Then, only the processing result thus obtained is outputted serially to a central processing unit (hereinafter a "CPU").

Incidentally, as the image sensor module described above, there have recently been proposed image sensor modules that use different output formats (for example, YUV output format and RAW output format) having different output bus widths. It is for this reason that highly-versatile serial interface devices that have different input bus widths so as to support any of the different output formats are sought after.

FIG. 4 is a block diagram showing an example of a conventional serial interface device. In this example, it is assumed that an 8- or 12-bit image signal DATA is inputted.

In this conventional serial interface device, the writing of the image signal DATA to a line memory block 102 is performed in such a way that the image signal DATA is written thereto eight or twelve bits at a time in parallel based on a first clock signal PCLK.

On the other hand, the reading of the image signal DATA is performed by a line memory read block 103 in such a way that, regardless of whether the stored image signal DATA is composed of eight or twelve bits, the image signal DATA is read eight bits at a time in parallel based on a second clock signal FCLK.

As a result, in a case where an 8-bit image signal DATA is stored in the line memory block 102, it is sequentially read at each pulse of the second clock signal FCLK. However, in a case where a 12-bit image signal DATA is stored, the reading thereof is performed as follows. For example, the lower eight bits (7:0) of a first image signal DATA are read at the first pulse of the second clock signal FCLK, then the upper four bits (11:8) of the first image signal DATA and the lower four bits (3:0) of a second image signal DATA are collectively read at the second pulse of the second clock signal FCLK, and then the upper eight bits (11:4) of the second image signal DATA are read at the third pulse of the second clock signal FCLK.

The second clock signal FCLK described above is a clock signal obtained by multiplying the first clock signal PCLK by a factor of 8 by a PLL (phase locked loop) circuit 106 and then dividing the frequency thereof by 8 by a frequency divider circuit 107. That is, the second clock signal FCLK is substantially the same as the first clock signal PCLK.

On the other hand, in a parallel/serial conversion block 104 (hereinafter, a "P/S block 104"), the 8-bit parallel data PDATA read by the line memory read block 103 is converted into 1-bit serial data SDATA. At this point, the P/S block 104 performs such conversion based on a third clock signal PLLCLK obtained by multiplying the first clock signal PCLK by a factor of 8.

As will be understood from the above description, this conventional serial interface device uses the line memory block 102 for temporarily storing the image signal DATA, so as to deal with an input of twelve bits while keeping the multiplication factor of the PLL circuit 106, which produces from the first clock signal PCLK the third clock signal PLLCLK needed to drive the P/S block 104, at a value (i.e., 8) appropriate for an input of eight bits.

FIG. 5 is a block diagram showing another example of a conventional serial interface device. Also in this example, it is assumed that an 8- or 12-bit image signal DATA is inputted.

This conventional serial interface device includes a first circuit group composed of: a P/S block 204a (8-bit data→1-bit data); a PLL circuit 206a (multiplication by a factor of 8); and a frequency divider circuit 207a (frequency division by 8) for dealing with an input of eight bits, and a second circuit group composed of: a P/S block 204b (12-bit data→1-bit data); a PLL circuit 206b (multiplication by a factor of 12); and a frequency divider circuit 207b (frequency division by 12) for dealing with an input of twelve bits, the first circuit group and the second circuit group being connected in parallel. With this configuration, this conventional serial interface device selectively uses one of the two circuit groups by changing a signal line built with switches 208 to 211 according to whether the inputted image signal DATA is composed of eight or twelve bits.

Some examples of another conventional technology related to what has been described thus far are seen in JP-A-2000-324285 (hereinafter "Patent Document 1") and JP-A-H10-289032 (hereinafter "Patent Document 2").

Certainly, with the serial interface devices shown in FIGS. 4 and 5, it is possible to convert the inputted image signal DATA into 1-bit serial data SDATA regardless of the number of bits thereof, and then transmit it to a device in the following stage.

However, the serial interface device shown in FIG. 4 has the following drawbacks. In this serial interface device, the third clock signal PLLCLK needed for parallel/serial conversion by the P/S block 104 is always produced by multiplying the first clock signal PCLK by a factor of 8, and accordingly the second clock signal FCLK needed for the reading by the line memory read block 103 has always the same frequency as that of the first clock signal PCLK.

This poses no special problem so long as the inputted image signal DATA is eight bits. However, if the inputted image signal DATA is twelve bits, since serial conversion thereof cannot be completed at each pulse of the first clock signal PCLK, it is necessary to use the line memory block 102 occupying a large layout area for storing the part of the inputted image signal DATA which is not yet converted.

Additionally, if the inputted image signal DATA is twelve bits, the serial interface device shown in FIG. 4 requires a serial output period (1.5×) 1.5 times longer than the input period (×). As a result, in a case where this serial interface device is applied to the image forming apparatus described above, as shown in FIG. 6, it is necessary to set a blanking period T (a period during which an input is prohibited) of the image signal DATA to be longer than necessary so as to prevent overlap between the output periods of the consecutive serial data SDATA. This hinders the high-speed transmission of the image signal DATA.

On the other hand, the serial interface device shown in FIG. 5 does not have the above drawbacks. However, this serial interface device requires different circuit groups (in particular, different P/S blocks operating at high speed) for dealing with an input of eight bits and an input of twelve bits separately. This leads to an unduly large device scale and an unduly high cost.

The conventional technology disclosed in Patent Document 1 simply relates to how to change the rate of transmission to the amount of information in an LVDS system having a PLL circuit on both transmission and reception sides, and is therefore completely different from the present invention.

Likewise, the conventional technology disclosed in Patent Document 2 simply relates to how to automatically check the setting of a multiplication factor by comparing the frequency of a reference clock signal with the frequency of an input clock signal, and is therefore completely different from the present invention.

SUMMARY OF THE INVENTION

In view of the conventionally experienced problems described above, an object of the present invention is to provide serial interface devices that can flexibly deal with parallel inputs having different bus widths without unduly increasing a device scale and cost, and to provide image forming apparatuses using such serial interface devices.

To achieve the above object, according to one aspect of the present invention, a serial interface device is provided with: a FIFO portion to which m- or n-bit (m<n) parallel data is written based on a first clock signal; a FIFO reader that reads the parallel data written to the FIFO portion m bits at a time based on a second clock signal; a parallel/serial converter that converts the m-bit parallel data read by the FIFO reader into 1-bit serial data based on a third clock signal; a PLL circuit that produces the third clock signal by multiplying the first clock signal by a factor of m or n; and a frequency divider circuit that produces the second clock signal by dividing the frequency of the third clock signal by m. Here, the multiplication factor of the PLL circuit is so controlled as to be changed according to the number of bits of the parallel data written to the FIFO portion.

Other features, elements, steps, advantages and characteristics of the present invention will become more apparent from the following detailed description of preferred embodiments thereof with reference to the attached drawings.

BRIEF DESCRIPTION OF THE DRAWINGS

FIG. 2A is a diagram illustrating the writing to a FIFO block 22 performed when 8-bit data is inputted;

FIG. 2B is a diagram illustrating the reading from the FIFO block 22 performed when 8-bit data is inputted;

FIG. 3A is a diagram illustrating the writing to the FIFO block 22 performed when 12-bit data is inputted;

FIG. 3B is a diagram illustrating the reading from the FIFO block 22 performed when 12-bit data is inputted;

DETAILED DESCRIPTION OF PREFERRED EMBODIMENTS

Figure 1:
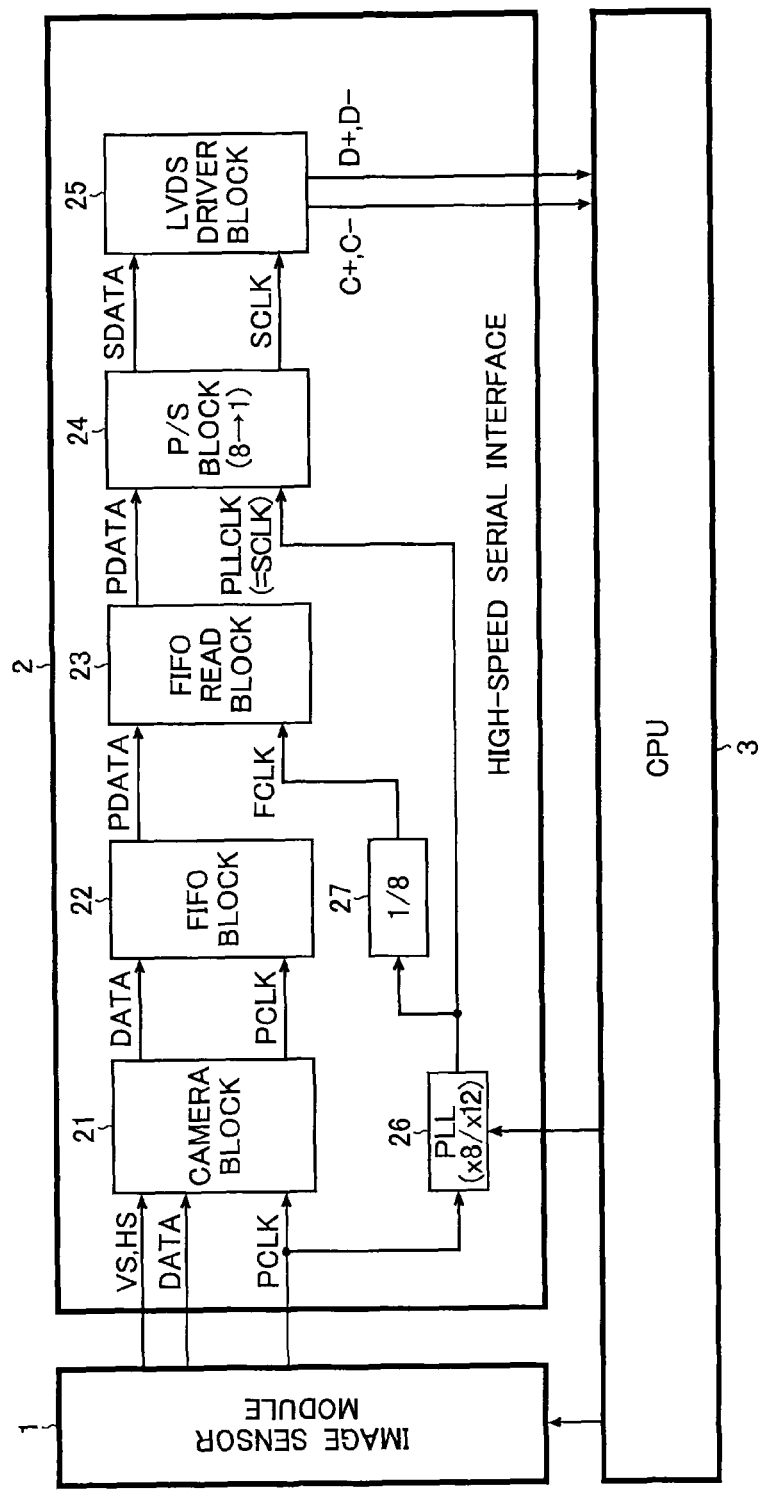
FIG. 1 is a block diagram showing an embodiment of an image forming apparatus according to the present invention.

FIG. 1 is a block diagram showing an embodiment of an image forming apparatus according to the present invention. Some examples of the image forming apparatus to which the present invention can be applied are digital still cameras and digital video cameras (including, for example, PDAs (personal digital/data assistants) and portable telephone terminals having a camera function), and scanners.

As shown in FIG. 1, the image forming apparatus of this embodiment includes an image sensor module 1, a high-speed serial interface device 2 (hereinafter a "serial I/F" 2), and a central processing unit 3 (hereinafter a "CPU" 3).

The image sensor module 1 converts an optical signal obtained from a subject into an electrical signal by using a CCD (charge coupled device) image sensor or a CMOS (complementary metal oxide semiconductor) image sensor, and thereby producing an image signal DATA that is compliant with its output format. It is to be noted that the image sensor module 1 of this embodiment can select its output format from among YUV output format (Y/color difference component output format) and RAW output format.

The above-described YUV output format is an output format where the color of each pixel is represented by three pieces of information: a brightness signal (Y), the difference (U) between the brightness signal and a blue component, and the difference (V) between the brightness signal and a red component. When the YUV output format is selected as the output format of the image sensor module 1, typically, an 8-bit image signal DATA is transmitted in parallel to the serial I/F 2.

On the other hand, the above-described RAW output format is an output format where raw data that undergoes no signal processing in the image sensor module 1, that is, the data that is obtained by simply digitalizing an electrical signal obtained from an imaging element such as a CCD image sensor or a CMOS image sensor, is directly outputted. When the RAW output format is selected as the output format of the image sensor module 1, typically, a 12-bit image signal DATA is transmitted in parallel to the serial I/F 2.

In addition to the image signal DATA described above, the image sensor module 1 feeds a frame synchronizing signal (a vertical synchronizing signal VS and a horizontal synchronizing signal HS) and a first clock signal PCLK to the serial I/F 2.

The serial I/F 2 is provided near the image sensor module 1. The serial I/F 2 performs high-speed image processing on the image signal DATA inputted thereto in parallel from the image sensor module 1, and then transmits, to the CPU 3, only the processing result as a low-voltage differential serial signal (C+, C−, D+, or D−). The use of such a serial I/F 2 of a differential output type helps reduce not only noise and parasitic emissions but also the number of signal transmission paths from the image sensor module 1 to the CPU 3, making it possible to increase the flexibility of system layout.

The CPU 3 receives the low-voltage differential serial signal inputted from the serial I/F 2, and controls display and recording processing. The CPU 3 also switches the output format of the image sensor module 1 according to operation by the user, for example. Furthermore, the CPU 3 changes the multiplication factor of a PLL (phase locked loop) circuit 26 constituting the serial I/F 2 according to the output format of the image sensor module 1. A detailed description thereof will be given later.

Next, the internal configuration of the serial I/F 2 will be described more specifically.

As shown in FIG. 1, the serial I/F 2 of this embodiment includes a camera block 21, a FIFO (first-in first-out) block 22, a FIFO read block 23, a parallel/serial conversion block 24 (hereinafter a "P/S (parallel/serial) block 24"), an LVDS (low voltage differential signaling) driver block 25, a PLL circuit 26, and a frequency divider circuit 27.

The camera block 21 serves as image processing means that performs predetermined image processing on the image signal DATA inputted in parallel from the image sensor module 1 based on the first clock signal PCLK and then writes the resultant signal to the FIFO block 22. Examples of the above-described image processing are trimming for cutting a necessary portion of the frame and polarity matching for the frame synchronizing signals VS and HS.

The FIFO block 22 serves as temporary storage means to which the 8- or 12-bit image signal DATA on which image processing is performed by the camera block 21 is written based on the first clock signal PCLK.

The FIFO read block 23 reads the image signal DATA written to the FIFO block 22 eight bits at a time based on a second clock signal FCLK. How such reading is specifically performed in the FIFO read block 23 will be described in detail later.

The P/S block 24 converts the 8-bit parallel data PDATA read by the FIFO read block 23 into 1-bit serial data SDATA based on a third clock signal PLLCLK (=SCLK).

The LVDS driver block 25 converts the serial data SDATA produced by the P/S block 24 into a low-voltage differential serial signal (C+, C−, D+, or D−) based on the third clock signal SCLK (=PLLCLK) and then sends the resultant signal to the CPU 3.

The PLL circuit 26 multiplies the first clock signal PCLK by a factor of 8 or 12 so as to produce the third clock signal PLLCLK (=SCLK). The multiplication factor thereof is so controlled as to be changed based on the instruction from the CPU 3 according to the number of bits (i.e., the output format of the image sensor module 1) of the image signal DATA written to the FIFO block 22.

Now, a more detailed description will be given in accordance with this embodiment. In a case where the output format of the image sensor module 1 is set to the YUV output format and an 8-bit image signal DATA is inputted to the serial I/F 2, the multiplication factor of the PLL circuit 26 is set to a value (i.e., 8) appropriate for an input of eight bits. On the other hand, in a case where the output format of the image sensor module 1 is set to the RAW output format and a 12-bit image signal DATA is inputted to the serial I/F 2, the multiplication factor of the PLL circuit 26 is set to a value (i.e., 12) appropriate for an input of twelve bits.

The frequency divider circuit 27 produces the second clock signal FCLK by dividing the frequency of the third clock signal PLLCLK (=SCLK) by 8. That is, in a case where the 8-bit image signal DATA is inputted to the serial I/F 2, the second clock signal FCLK thus produced is substantially the same as the first clock signal PCLK. On the other hand, in a case where the 12-bit image signal DATA is inputted to the serial I/F 2, the second clock signal FCLK thus produced has a frequency 1.5 times higher than the first clock signal PCLK.

Next, the operation of the serial I/F 2 configured as described above will be described in detail.

First, with reference to FIGS. 2A and 2B, the reading from and writing to the FIFO block 22 performed when 8-bit data is inputted will be described in detail.

FIG. 2A is a diagram illustrating the writing to the FIFO block 22 performed when 8-bit data is inputted, and FIG. 2B is a diagram illustrating the reading from the FIFO block 22 when 8-bit data is inputted.

In a case where the 8-bit image signal DATA is inputted from the image sensor module 1, the writing to the FIFO block 22 is performed in such a way that, as shown in FIG. 2A, the 8-bit image signal DATA (7:0) is sequentially written to the FIFO block 22 at each pulse of the first clock signal PCLK.

On the other hand, the reading from the FIFO block 22 is performed in such a way that, as shown in FIG. 2B, the 8-bit image signal DATA (7:0) written to the FIFO block 22 is read in its entirety as 8-bit parallel data PDATA at each pulse of the second clock signal FCLK.

In the P/S block 24, based on the third clock signal PLLCLK obtained by multiplying the first clock signal PCLK by a factor of 8, the 8-bit parallel data PDATA is converted into 1-bit serial data SDATA.

Next, with reference to FIGS. 3A and 3B, the reading from and writing to the FIFO block 22 performed when 12-bit data is inputted will be described in detail.

FIG. 3A is a diagram illustrating the writing to the FIFO block 22 when 12-bit data is inputted, and FIG. 3B is a diagram illustrating the reading from the FIFO block 22 when 12-bit data is inputted.

In a case where the 12-bit image signal DATA is inputted from the image sensor module 1, the writing to the FIFO block 22 is performed in such a way that, as shown in FIG. 3A, the 12-bit image signal DATA (11:0) is sequentially written to the FIFO block 22 at each pulse of the first clock signal PCLK.

On the other hand, the reading from the FIFO block 22 is performed in such a way that, as shown in FIG. 3B, the image signal DATA (11:0) written to the FIFO block 22 is read eight bits at a time as 8-bit parallel data PDATA at each pulse of the second clock signal FCLK.

Now, a detailed description will be given in accordance with this embodiment. At the first pulse of the second clock signal FCLK, the lower eight bits D1 (7:0) of a first image signal DATA is read, at the second pulse of the second clock signal FCLK, the lower eight bits D2 (7:0) of a second image signal DATA is read, and then at the third pulse of the second clock signal FCLK, the upper four bits D1 (11:8) of the first image signal DATA and the upper four bits D2 (11:8) of the second image signal DATA are collectively read.

Figure 4:
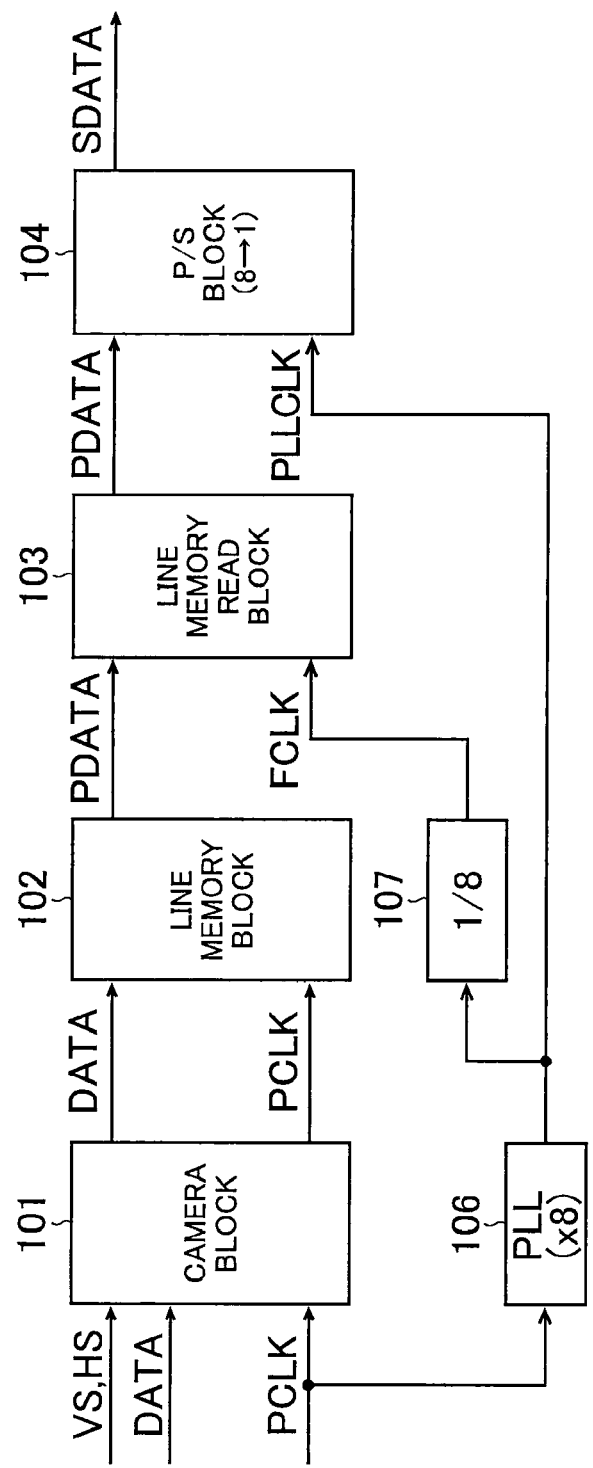
FIG. 4 is a block diagram showing an example of a conventional serial interface device.
Figure 5:
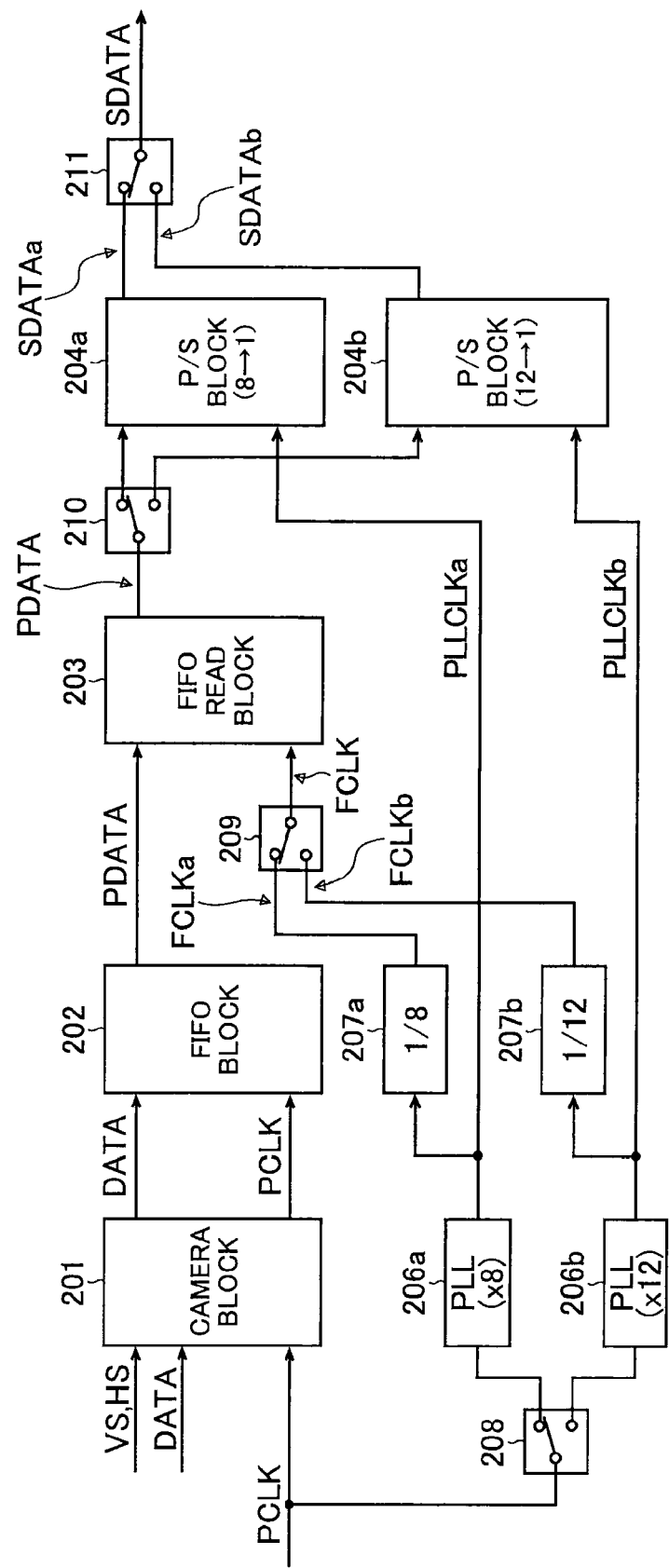
FIG. 5 is a block diagram showing an example of another conventional serial interface device.

Here, in the conventional configuration (see FIG. 4, which has been described earlier) in which the second clock signal FCLK has always the same frequency as that of the first clock signal PCLK, it is necessary to use a line memory block for storing the image signal DATA. By contrast, in the serial I/F 2 of this embodiment, since the multiplication factor of the PLL circuit 26 is changed from 8 to 12 when 12-bit data is inputted, the second clock signal FCLK has a frequency 1.5 times higher than the first clock signal PCLK as shown in FIG. 3B. As a result, in the FIFO read block 23, two 12-bit image signals DATA corresponding to two pixels are split into three pieces of 8-bit parallel data PDATA, so that the reading thereof is performed without delay. This eliminates the need to use the line memory block described above.

In the P/S block 24, the 8-bit parallel data PDATA is converted into 1-bit serial data SDATA based on the third clock signal PLLCLK obtained by multiplying the first clock signal PCLK by a factor of 12.

As described above, the serial I/F 2 of this embodiment is a high-speed serial interface device provided with: the FIFO block 22 to which 8- or 12-bit image signal DATA is written based on the first clock signal PCLK; the FIFO read block 23 that reads the image signal DATA written to the FIFO block 22 eight bits at a time based on the second clock signal FCLK; the P/S block 24 that converts the 8-bit parallel data PDATA read by the FIFO read block 23 into 1-bit serial data SDATA based on the third clock signal PLLCLK; the PLL circuit 26 that produces the third clock signal PLLCLK by multiplying the first clock signal PCLK by a factor of 8 or 12; and the frequency divider circuit 27 that produces the second clock signal FCLK by dividing the frequency of the third clock signal PLLCLK by 8. The multiplication factor of the PLL circuit 26 is so controlled as to be changed according to the number of bits of the image signal DATA written to the FIFO block 22.

Figure 6:
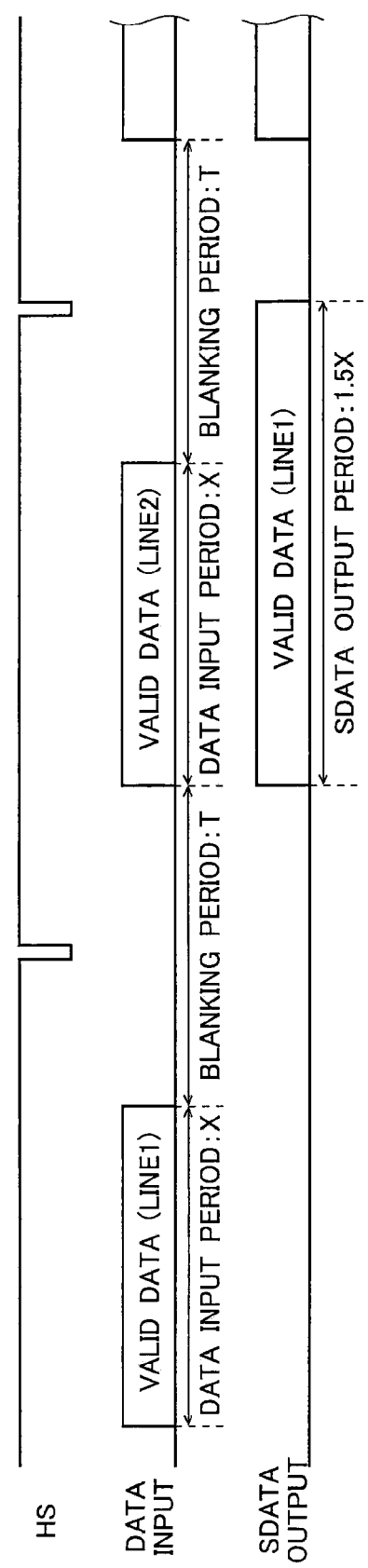
FIG. 6 is a diagram illustrating the problem which arises when a circuit for 8-bit input is also used for 12-bit input.

With the above-described configuration in which the multiplication factor of the PLL circuit 26 is controlled according to the input bus width so that the transmission protocol is kept at a constant bus width, there is no necessity to provide a plurality of P/S blocks 24 operating at high speed, one for each of the different input bus widths, and to use a line memory that occupies a large layout area. This makes it possible to flexibly deal with parallel inputs having different bus widths without unduly increasing a device scale and cost. Moreover, the absence of the line memory eliminates the limitation on the input blanking period, which has been described earlier by referring to FIG. 6.

The embodiment described above deals with an example in which the invention is applied to serial interface devices incorporated in image forming apparatuses. This, however, is not meant to limit the application of the invention in any way; the invention finds wide application in serial interface devices used for any other purpose.

The invention may be practiced in any other manner than specifically described above, with any modification or variation made within the spirit of the invention.

For example, the embodiment described above deals with an example in which 8- or 12-bit parallel data is inputted to the serial interface device. This, however, is not meant to limit the application of the invention in any way; the input bus width may be changed to any given width at the design stage. Moreover, the number of options of the input bus width described above is not limited to two; it is also possible to adopt a configuration in which an appropriate input bus width is selected from among three or more options.

For example, in a case where an m-bit, n-bit, or x-bit (m<n<x) image signal DATA is inputted, the following configuration may be adopted. The FIFO read block 23, the P/S block 24, and the frequency divider circuit 27 are so configured as to be suitable for an input of m-bits, as is the case with the embodiment described above, and only the PLL circuit 26 is so configured that the multiplication factor thereof can be appropriately selected from among factors of m, n, and x.

The invention offers the following advantages: it helps realize serial interface devices and image forming apparatuses using such serial interface devices that can flexibly deal with parallel inputs having different bus widths without unduly increasing a device scale and cost.

In terms of industrial applicability, the invention is useful in achieving miniaturization and cost reduction of serial interface devices having different input bus widths. For example, the invention is suitable to serial interface devices incorporated in image forming apparatuses such as digital still cameras, digital video cameras, or scanners.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the present invention which fall within the true spirit and scope of the invention.

What is claimed is:

1. A serial interface device comprising:
   a FIFO portion to which 8 or 12 bit parallel data is written based on a first clock signal;
   a FIFO reader that reads the parallel data written to the FIFO portion 8 bits at a time based on a second clock signal;
   a parallel/serial converter that converts the 8-bit parallel data read by the FIFO reader into 1-bit serial data based on a third clock signal;
   a PLL circuit that produces the third clock signal by multiplying the first clock signal by a factor of 8 or 12; and
   a frequency divider circuit that produces the second clock signal by dividing a frequency of the third clock signal by 8,
   wherein a multiplication factor of the PLL circuit is so controlled as to be changed according to a number of bits of the parallel data written to the FIFO portion such that, when the number of bits is 8, the multiplication factor is 8 and, when the number of bits is 12, the multiplication factor is 12, and
   wherein the FIFO reader operates according to the number of bits of the parallel data written to the FIFO portion, such that when the number of bits is 8, operation is at a frequency equal to a frequency of the first clock signal, and when the number of bits is 12, operation is at a frequency 1.5 times the frequency of the first clock signal,
   and wherein when a number of bits of the parallel data written to the FIFO portion is 12, the FIFO reader reads 8 bits of a first parallel data at a first pulse of the second clock signal, reads 8 bits of a second parallel data at a second pulse of the second clock signal, and reads 4 residual bits of the first parallel data and 4 residual bits of the second parallel data at a third pulse of the second clock signal.

2. The serial interface device of claim 1, further comprising:
   a low-voltage differential transmission driver that converts the serial data produced by the parallel/serial converter into a low-voltage differential serial signal based on the third clock signal, and then sends the resultant low-voltage differential serial signal to an outside.

3. The serial interface device of claim 2, further comprising:
   an image processor that performs, based on the first clock signal, predetermined image processing on an image signal inputted in parallel from an outside, and then writes the resultant signal to the FIFO portion.

4. An image forming apparatus comprising:
   an image sensor that produces an image signal;
   a serial interface device that converts the image signal inputted in parallel from the image sensor into a low-voltage differential serial signal; and
   a central processing unit to which the low-voltage differential serial signal is inputted from the serial interface device;
   wherein the serial interface device comprises:
     an image processor that performs, based on a first clock signal, predetermined image processing on an 8 or 12 bit image signal inputted in parallel from an outside;
     a FIFO portion to which the 8 or 12-bit parallel data on which image processing is performed by the image processor is written based on the first clock signal;
     a FIFO reader that reads the parallel data written to the FIFO portion 8 bits at a time based on a second clock signal;

a parallel/serial converter that converts the 8-bit parallel data read by the FIFO reader into 1-bit serial data based on a third clock signal;

a PLL circuit that produces the third clock signal by multiplying the first clock signal by a factor of 8 or 12;

a frequency divider circuit that produces the second clock signal by dividing a frequency of the third clock signal by 8; and a low-voltage differential transmission driver that converts the serial data produced by the parallel/serial converter into a low-voltage differential serial signal and then sends the resultant low-voltage differential serial signal to an outside, wherein a multiplication factor of the PLL circuit is so controlled as to be changed according to a number of bits of the parallel data written to the FIFO portion such that, when, the number of bits is 8, the multiplication factor is 8 and, when the number of bits is 12, the multiplication factor is 12, and wherein the FIFO reader operates according to the number of bits of the parallel data written to the FIFO portion, such that when the number of bits is 8, operation is at a frequency equal to a frequency of the first clock signal, and when the number of bits is 12, operation is at a frequency 1.5 times the frequency of the first clock signal, and wherein when a number of bits of the parallel data written to the FIFO portion is 12 the FIFO reader reads 8 bits of a first parallel data at a first pulse of the second clock signal reads 8 bits of a second parallel data at a second pulse of the second clock signal, and reads 4 residual bits of the first parallel data and 4 residual bits of the second parallel data at a third pulse of the second clock signal.

5. The image forming apparatus of claim 4, wherein the central processing unit changes the multiplication factor of the PLL circuit constituting the serial interface device according to an output format of the image sensor.

\* \* \* \* \*